United States Patent [19]
Prybyla et al.

[11] Patent Number: 5,736,424
[45] Date of Patent: Apr. 7, 1998

[54] DEVICE FABRICATION INVOLVING PLANARIZATION

[75] Inventors: Judith Ann Prybyla, Edison; Gary Newton Taylor, Bridgewater, both of N.J.

[73] Assignee: Lucent Technologies Inc., Murray Hill, N.J.

[21] Appl. No.: 695,181

[22] Filed: Aug. 1, 1996

Related U.S. Application Data

[63] Continuation of Ser. No. 245,279, May 18, 1994, abandoned, which is a continuation-in-part of Ser. No. 593,362, Oct. 1, 1990, which is a continuation of Ser. No. 349,975, May 8, 1989, abandoned, which is a continuation of Ser. No. 20,332, Feb. 27, 1987, abandoned.

[51] Int. Cl.$^6$ .................................................. H01L 21/311
[52] U.S. Cl. ........................... 437/228; 427/370; 427/103; 437/229
[58] Field of Search ........................ 437/212, 218, 437/228 G, 228 PL; 427/103

[56] References Cited

U.S. PATENT DOCUMENTS

| | | |
|---|---|---|
| 4,515,828 | 5/1985 | Economy et al. |
| 4,553,153 | 11/1985 | McColgin et al. ............... 357/30 |
| 4,599,136 | 7/1986 | Araps et al. |
| 4,619,837 | 10/1986 | Brown ........................... 427/44 |

(List continued on next page.)

FOREIGN PATENT DOCUMENTS

| | | |
|---|---|---|
| 0050512 | 4/1982 | European Pat. Off. |
| 62-128534 | 6/1987 | Japan. |
| 63-216848 | 10/1988 | Japan. |
| 1-12561 | 1/1989 | Japan. |

OTHER PUBLICATIONS

"Planarization Properties of Resist and Polyimide Coatings", by L. K. White, *Journal of the Electrochemical Society: Solid–State Science and Technology*, Jul. 1983, pp. 1543–1548.

"Planarization of Phosphorus–Doped Silicon Dioxide", by A. C. Adams et al., *Journal of the Electrochemical Society: Solid–State Science and Technology*, Feb. 1981, vol. 128, No. 2, pp. 423–429.

(List continued on next page.)

*Primary Examiner*—George R. Fourson
*Attorney, Agent, or Firm*—Richard J. Botos

[57] ABSTRACT

Planarization of geometrically difficult semiconductor device surfaces is accomplished utilizing a coating technique in which on an object with a flat surface is used to planarize the coating material. In particular, device processing is accomplished by including a step that produces a planar surface by coating a nonplanar surface with a material that has a viscosity of less than 1000 cp. An object with a flat surface is placed into contact with the material in such a manner that the material is planarized to a desired degree. The material is cured while in contact with the object's flat surface. The object is then separated from the material. The planarity of the planarizing material is then transferred into the underlying layer using conventional techniques.

11 Claims, 6 Drawing Sheets

U.S. PATENT DOCUMENTS

| | | |
|---|---|---|
| 4,635,356 | 1/1987 | Ohuchi et al. . |
| 4,643,910 | 2/1987 | Foutz . |
| 4,689,289 | 8/1987 | Crivello ................................. 430/270 |
| 4,698,294 | 10/1987 | Lau et al. . |
| 4,699,803 | 10/1987 | Araps et al. . |
| 4,713,356 | 12/1987 | Hiruta . |
| 4,741,926 | 5/1988 | White et al. . |
| 4,871,619 | 10/1989 | Araps et al. . |
| 4,882,201 | 11/1989 | Crivello et al. ...................... 427/54.1 |
| 4,983,545 | 1/1991 | Gokan et al. . |
| 5,013,609 | 5/1991 | Yamamoto et al. ....................... 47/229 |
| 5,137,751 | 8/1992 | Burgess et al. . |
| 5,276,126 | 1/1994 | Rogler . |
| 5,367,766 | 11/1994 | Burns et al. . |
| 5,434,107 | 7/1995 | Paranjpe ............................ 437/228 PL |

OTHER PUBLICATIONS

"Properties of Thin Polyimide Films", by L. B. Rothman, *Journal of the Electrochemical Society: Solid–State Science and Technology*, vol. 127, No. 10, Oct. 1980, pp. 2216–2220.

"High Resolution, Steep Profile Resist Patterns", by J. M. Moran et al., *J. Vac. Sci. Technol.*, vol. 16(6), Nov./Dec. 1979, pp. 1620–1624.

"Multilayer Resist Systems for Lighography", by M. Hatzakis, *Solid State Technology*, Aug. 1981, pp. 74–80.

Trilayer Resist Processing Using Spin–On Glass Intermediate Layers, by S. K. Gupta et al., *SPIE*, vol. 469 Advances in Resist Tecnology (1984), pp. 3–12.

DEVICE FABRICATION INVOLVING PLANARIZATION

This application is a continuation of application Ser. No. 08/245,279, filed on May 18, 1994, now abandoned, which is a continuation-in-part of application Ser. No. 07/593,362 filed Oct. 1, 1990, which is a continuation of application Ser. No. 07/349,975 filed May 8, 1989 and now abandoned which is a continuation of application Ser. No. 07/020,332, filed Feb. 27, 1987, now abandoned. The contents of application Ser. Nos. 07/593,362, 07/349,975 and 07/020,332 are hereby incorporated by reference. Application Ser. No. 07/593,362 is the subject of Interference No. 102,814 (Chandross et al. v. Brown).

BACKGROUND OF THE INVENTION

1. Technical Field

This invention relates to device processing and in particular device processing utilizing the planarization of a nonplanar surface.

2. Art Background

The fabrication of devices such as semiconductor devices almost invariably produces surfaces which are nonplanar in configuration. For example, typically in the fabrication of silicon devices, a multiplicity of layers are formed sequentially on a silicon substrate. Many of these layers are processed into a desired pattern by selective deposition or by removing desired regions of the layer. As more and more layers are built upon underlying nonplanar layers, the irregularity of the surface typically becomes more and more pronounced. Such surface irregularity is referred to generally as topography.

The irregularity of a surface naturally appears in a layer that is deposited over that surface. As illustrated in FIG. 1, a device 110 is formed on a substrate 100. A layer of dielectric 120 is formed over the device 110. Windows 130 are then formed in the dielectric 120 and filled with metal 135. More metal 140, is then formed on the substrate and is patterned to form the interconnects. Another layer of dielectric 150 is then deposited over the metal 140. As illustrated by FIG. 1, the surface irregularity of each layer is present in each succeeding layer.

Such irregularity in some situations presents significant problems. For example, the patterning of a layer is generally accomplished by a lithographic process; e.g., a photosensitive material is deposited, exposed to radiation in the desired pattern, and developed to reveal the exposed pattern. Typically, if a resist material of reasonable thickness is deposited on an irregular surface, it will have a corresponding irregularity. However, to produce a well-resolved exposure, it is necessary to focus the exposing light at a specific depth and to maintain focus over a range of depths that is at least two times the feature width. If the resist material is not planar, the exposure image will not be entirely in focus across the wafer and throughout the film thickness. Thus, the probability of obtaining degraded lithographic results is significantly increased. Also, surface irregularity adversely affects device interconnect reliability because the metal layer deposited over the surface irregularity has turns or bends which conform to the surface irregularity. These bends or turns can cause current crowding in the metal layer, which is undesired.

To avoid the consequences associated with surface irregularity in device fabrication, processes are used to planarize the device surface on which the photosensitive material is deposited. Such surface irregularity is referred to generally as topography. For example, to planarize an irregular device surface by an etch-back technique, a material is deposited on a surface in a manner adapted to form a surface relatively free of topography, i.e. a planar surface. If the device layer and the overlying material layer have approximately the same etch rate, etching proceeds through the planarizing material and into the device layer with the surface configuration of the planarizing layer being transferred to the device material surface. Although this technique has been adequate for some applications where a modest degree of planarity is required, present planarizing materials and present methods for depositing the planarizing material are often inadequate to furnish the necessary planar surface for demanding applications such as in submicron device fabrication. (Referring to FIG. 2, the degree of planarization is defined as the difference between the depth of the topography on the device surface $h_t$, as denoted by 13 and the vertical distance between a high point and a low point on the overlying material surface $h_d$, as denoted by 12, divided by the depth of the topography on the device surface $h_t$, i.e.

$$\frac{h_t - h_d}{h_t}.$$

The degree of planarization, in percent, is $$\frac{h_t - h_d}{h_t} \times 100.)$$

Generally, for typical device configurations, planarization using the etch-back technique has not been better than approximately 55% as calculated by the method described above for features greater than 300 µm in width. The low degree of planarization achieved by this technique is attributed to a lack of planarity in the planarizing material. Thus for elongated gap type features greater than 300 µm in width and 0.5 µm in depth, the usefulness of an etch-back technique has been limited.

Techniques such as chemical-mechanical polishing (CMP) are also used to obtain a planar surface over irregular substrate surfaces. In CMP, the surface is simply polished until the desired degree of planarity is achieved. Although this technique, in principle, yields surfaces with a high degree of planarity, it does require a high degree of process control to obtain the desired results.

Since the problems that are introduced by nonplanar configurations are anticipated to worsen with the evolving sophistication of very large scale integration, an improved process for surface planarization in device fabrication is desired.

SUMMARY OF THE INVENTION

The present invention is a process for planarizing a surface using a resist-etchback technique. The process of the present invention uses an object with a flat surface to planarize a material of appropriate viscosity after it is formed on the substrate surface. That is, the planarization material is forced into planarity by contacting the planarization material with the object having a flat surface.

Objects with sufficiently flat surfaces for use in the present process are well known to those skilled in the art. One example of such an object is an optical flat made of fused silica. The flat surface is configured to transfer the desired degree of planarity to the planarization material.

The planarization material should have a viscosity of about 20 centipoise to about 1000 centipoise, preferably about 60 centipoise to about 200 centipoise and most preferably about 100 centipoise, when it is applied to the substrate surface. The planarization material is solidified while in contact with the flat surface by curing or by some other mechanism for solidifying the planarization material. The curing conditions depend upon the particular planarization material. Upon solidification, e.g., curing, the volume of the planarization material is reduced by less than about 10%. The cured planarization material has a surface planarity of at least about eighty-five percent over the initial topography. The initial topography is a function of the chip design and the processes used for fabricating the chip.

After the planarization material is cured, or after its viscosity has been increased, the flat surface is separated from contact with the planarization material. It is advantageous if the flat surface is coated with a release agent prior to planarization in order to facilitate this separation without degrading the planarity of the planarization material. The composition of the release agent will depend upon the composition of the planarization material. For example, if the planarization material is an epoxy material, the release agent on the flat surface is a material that is inert with respect to the planarizing material. That is, there is substantially no adhesive force between the release agent and the planarizing material when the flat surface is separated from contact with the planarizing material.

The planar surface is then transferred from the planarization material to the underlying material. In device fabrication, the underlying material is typically a dielectric material such as silicon dioxide or silicon nitride but could be any material with a non-planar surface. The planar surface is transferred to the underlying dielectric using known processing techniques such as plasma reactive ion etching. It is advantageous if the planarization material has an etching resistance that is about the same as the etching resistance of the underlying dielectric such as, e.g., plasma deposited $SiO_2$. Suitable etching conditions to effect the desired transfer will depend upon the particular materials that are to be etched. These etching conditions are known to those skilled in the art.

Not only is improved planarization achievable for a given surface configuration, but conversely, for a desired degree of planarization it is possible to acceptably process substantially more severe topography than conventional resist etchback techniques.

DETAILED DESCRIPTION

Figure 1:
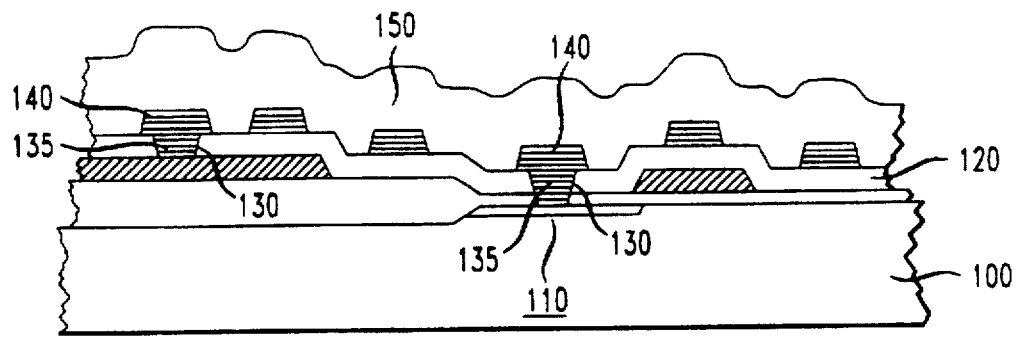
FIGS. 1 and 2 are illustrative of configurations involved in the invention.

The inventive device fabrication procedure including a specific planarization process yields great flexibility for device fabrication. As noted, when a specific feature is dictated by design considerations, the degree of planarization of this feature is substantially enhanced through use of the inventive procedure. Similarly, when a desired degree of planarization is essential in a device fabrication procedure and where there is flexibility in the particular structure, substantially more irregular features are suitably planarized utilizing the inventive technique.

In the present process, a planarization material is formed on a substrate surface and forced into planarity using an object with a flat surface. The flat surface has a flatness which is adequate to planarize the material to a degree of at least about sixty percent. In processes for device fabrication, it is advantageous if the flat surface has a flatness which is adequate to planarize the material to a degree of at least about eighty-five percent. The object with the flat surface contacts the planarizing material with sufficient force to transfer the flatness from the surface to the planarizing material.

To obtain the desired results in a process having a planarization step, the surface to be planarized is treated with a freely flowing planarizing material, i.e., a material that has a viscosity of about 20 cp to about 1000 cp, preferably about 60 cp to about 200 cp, and most preferably about 100 cp. This material should be capable of being solidified after it is planarized. Solidification occurs when the material is suited for subsequent processing. For example, if the planarization material is used in a resist etchback process, the resist material must be sufficiently solidified so that it will retain its planarity and so that its etching rate will be about the same as that of the underlying material. If the planarizing material is used in a lithographic process, the material must be solidified to the point that it is rigid and impermeable. One skilled in the art will be able to determine to what degree the planarization material should be solidified in a particular application.

Examples of suitable materials include monomers, monomer mixtures, oligomers, and oligomer mixtures that are solidified through curing. Other examples of suitable materials include solid materials such as polymer melts that are softened by heating, planarized and then resolidified through cooling. These materials are herein referred to as planarizing materials. It is advantageous if the planarizing material has a melting point of at least about 90° C. It is particularly advantageous if the planarizing material has a melting point of at least about 120° C. and preferably at least about 150° C. It is advantageous if the cured polymer or solid polymer melt is etched at the same rate as the material underlying the planarization material.

Planarizing materials that are solidified by curing are typically cured by combining the planarizing material with an acid generator that generates acid when heated or irradiated. The acid catalyzes polymerization. These acid generators are well known to those skilled in the art. The specific acid generator used depends upon the planarization material and the desired curing conditions.

Epoxy resins are examples of planarization materials that are suited for use in the present process. One example of a suitable epoxy resin is epoxy novolac 431 (DEN-431) which is commercially obtained from the Dow Chemical Co. The uncured resin has a viscosity of about 100 cp at a temperature of 100° C. The resin is cured at a temperature of about 100° C. in the presence of an acid catalyst. An example of a suitable acid catalyst is the photoacid generator triphenylsulphonium hexafluoroantimonate.

The planarizing material should shrink less than 10% by volume when solidified. Planarizing materials to which more than 10% by volume of solvent is added to achieve the desired viscosity are not compatible with the present process unless the planarizing material has a viscosity within the desired range before solidification is induced by expedients such as heating, cooling, etc. Suitable planarizing materials therefore have a viscosity (either before the solvent is added or after solvent evaporation) that permits it to flow when placed in contact with the flat surface.

Figure 2:
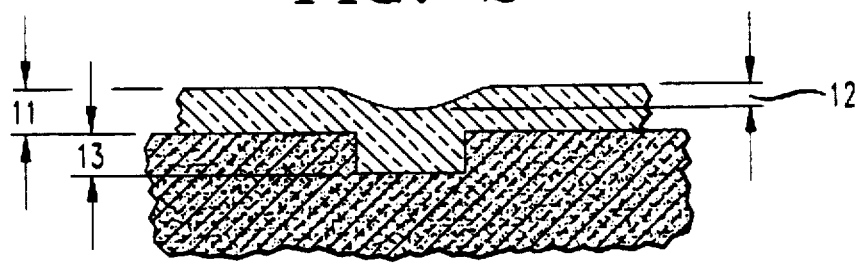

The thickness of the planarization layer after solidification should be greater than or equal to about one and one-half times the depth of a topographical feature on the substrate (13 in FIG. 2). Thicknesses much greater than this are not desirable because of excessive processing time, and thicknesses much less than this are not desirable because inadequate planarization results if material is not deposited above the highest topographic regions. For example, thicknesses greater than about 10 μm or less than 0.5 μm are generally undesirable.

It is also desirable that thickness non-uniformity of the planarizing material, i.e., thickness variations over an entire device or wafer, be maintained in the range 0.05 μm to 0.2 μm. If a greater than 0.2 μm thickness non-uniformity is produced, undesirable results are obtained.

In addition to appropriate viscosity and solidification properties, the materials utilized for planarizing should also have the properties necessary for their ultimate use in the device fabrication sequence. For example, if the planarizing material is to be utilized in an etch-back scheme, then the material should undergo removal by a specific etchant at a rate similar to the rate at which the underlying material is removed. For example, under given conditions, the rate at which the planarizing material is removed should be in a range that is within about five percent of the rate at which the underlying material is removed. One skilled in the art is familiar with how closely these etching rates are matched to achieve acceptable processing results.

If the material is to be utilized as a layer in a multilayer resist, the material should be susceptible to pattern transfer from the overlying photosensitive material. Exemplary materials suitable for etch-back procedures with an underlying material with a composition such as silicon dioxide are aromatic epoxy monomers. These materials are also suitable for utilization in multilayer resists. Additionally, it is desirable that the solidified planarization material have a $T_g$ higher than temperatures that are to be employed in subsequent processing steps. If the $T_g$ is lower, an undesirable change in surface configuration generally occurs upon subjecting the solidified planarizing layer to those temperatures.

Figure 3:
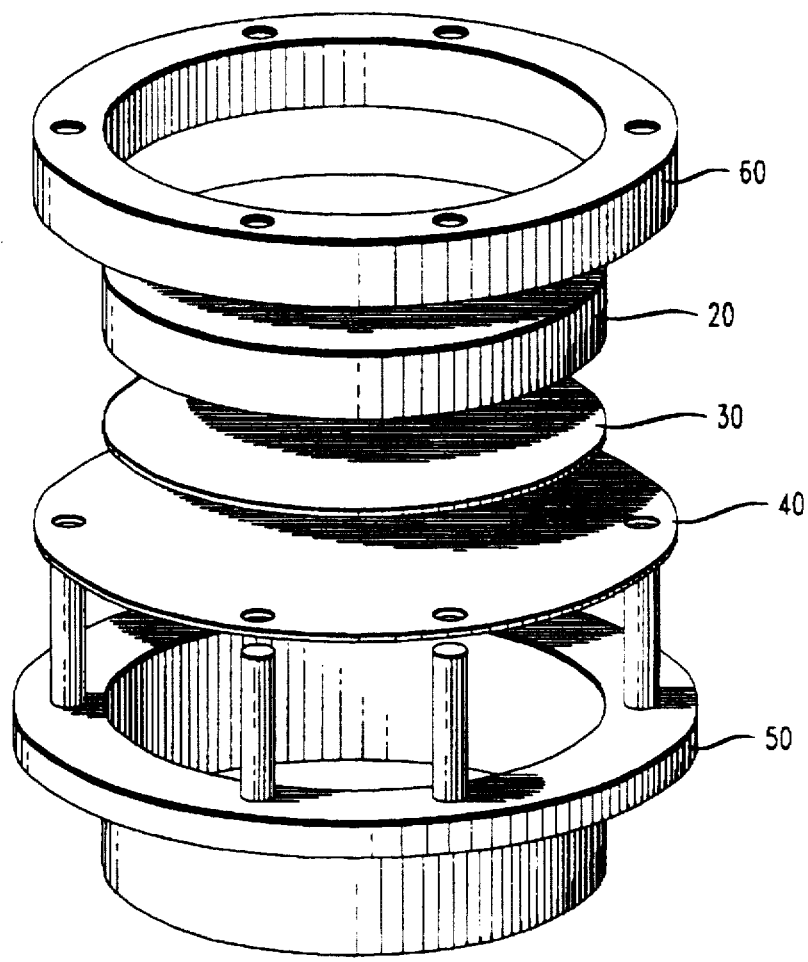
FIG. 3 is a schematic illustration of an assembly for introducing a flat surface onto a planarizing material.

After the planarization material is applied onto the substrate, but before the planarization material is cured, the planarizing material is contacted with the object with a flat surface to transfer the flatness of the surface to the planarization material. One example of such an object is depicted schematically in FIG. 3. In FIG. 3 the object is an optical flat 20. The silicon wafer 30 to be planarized is placed on a flexible mat 40 which is on top of a pressurizing chamber 50.

The unburdened planarizing material is applied in a flowable state on the top surface of the silicon wafer 30. The silicon wafer 30 is then placed on the flexible mat 40 with the side to be planarized facing toward the optical flat 20. The chamber 50 is then pressurized to about 10 to about 100 atmospheres, which presses the surface of the silicon wafer with the planarizing material thereon into contact with the optical flat. The planarizing material is then hardened using one of the previously described techniques.

The flexible mat 40 causes the wafer 30 and the optical flat 20 to be oriented parallel to each other. If the optical flat 20 flexes, even a small amount, the flexible mat 40 permits the wafer to flex a commensurate amount. Thus, the planar surface transferred to the wafer will not only have a flatness that is commensurate to the flatness of the optical flat, that flatness is in the appropriate plane in relation to the substrate surface.

The assembly illustrated in FIG. 3 is also provided with a retaining ring 60 which holds the assembly together. However, many different mechanisms are contemplated as useful for holding the optical flat in a place and a position for being placed in contact with a wafer surface. Many different expedients for placing the wafer in a position to be contacted by the optical flat are also contemplated, as are automated mechanisms for inserting the wafers into the assembly and removing them therefrom.

After the flat surface is placed into contact with the planarizing material, the planarizing material is hardened. The planarizing material is hardened while in contact with the flat surface. The expedient for hardening the planarizing material depends upon the planarizing material used. If the planarizing material is a monomer, oligomer, or mixture, thereof, it is advantageous if the material is hardened by polymerizing the material. In one embodiment, such materials are polymerized by combining the material with a compound that generates a polymerization acid catalyst when the monomer is exposed to some form of energy such as heat or light. There are numerous polymerization catalysts which are known to those skilled in the art. Examples of suitable polymerization acid catalysts are disclosed in U.S. Pat. Nos. 4,882,201 and 4,689,289 to Crivello et al., which are incorporated by reference herein. The efficacy of any particular catalyst will depend upon the material in which it is desired to induce polymerization.

In another embodiment the planarizing material is a material such as a polymer which is applied to the wafer surface, softened at elevated temperature, planarized by contact with the object with a flat surface, and hardened by cooling the material until it is no longer soft.

After the planarizing material is hardened, the flat surface is removed from contact with the planarizing material. Since the planarizing material is hardened while in contact with the planarizing surface, it is advantageous if the surface is coated with a release agent. The release agent aids the act of separating the flat surface from the planarizing material without disturbing the planarity of the planarizing material.

Again, the efficacy of a particular release agent depends upon the planarizing material. For example, if the planarizing material is the epoxy novolac DEN-431 previously described, the object's flat surface (a silica disc, for example) is coated with a layer of octadecyl trichlorosilane. The flat surface is coated by immersing the surface in a solution containing 3% octadecyl trichlorosilane in n-octane. One skilled in the art is familiar with many different materials that will act as release agents for the planarizing materials described herein.

After the material has been planarized, the planarity is transferred to the dielectric material underlying the planarized layer. As mentioned previously, for a given etching environment, it is advantageous if the etching rate of the planarizing material is equivalent to the etching rate of the underlying dielectric material. The planarity is transferred by any known method such as etching using a plasma. One skilled in the art will be able to select a planarizing material that is etched at the same rate as the underlying dielectric and to control etch uniformity based on the etching rate of the materials. It is contemplated that the planarizing material is etched using either whole wafer plasma etching or scanned and localized plasma etching.

In this application, the device is first fabricated on the substrate wafer using known techniques. Typically, a dielectric layer of $SiO_2$ material such as silicon dioxide ($SiO_2$) is then deposited over the patterned substrate wafer. The $SiO_2$ is deposited on the wafer using conventional techniques such as a plasma enhanced deposition using a precursor such as tetraethyl orthosilicate (PE-TEOS). Because the surface over which the dielectric is deposited contains topography, the surface of the deposited dielectric also contains topography. If the surface of the dielectric is not planarized at this point, the height of the topographic features will often be increased upon proceeding to the next steps in the fabrication sequence. This is because a deposited layer tends to conform to the layer over which it is deposited. Depending on the severity of the topography in the first level of dielectric deposited on the device, the planarization is optionally deferred until after the first level of metal is deposited and patterned and a second layer of dielectric is deposited on the substrate.

As shown in FIG. 1, in one typical process the device 110 is fabricated on a wafer 100. A layer of dielectric 120 is deposited over the device 110. Windows 130 that connect with the underlying device 110 are patterned in the dielectric 120. These windows 130 are filled with metal 135. More metal 140 is then deposited over the entire wafer and patterned into the desired interconnects. Another layer of dielectric 150 is then deposited over the patterned metal 140.

Figure 4A:
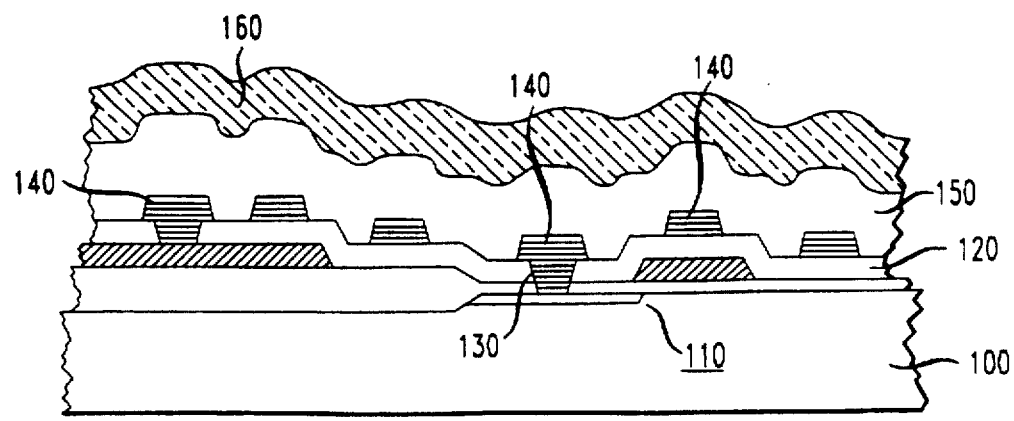
FIGS. 4A, 4B and 5 are illustrative of the planarization process of the present invention.
Figure 4B:
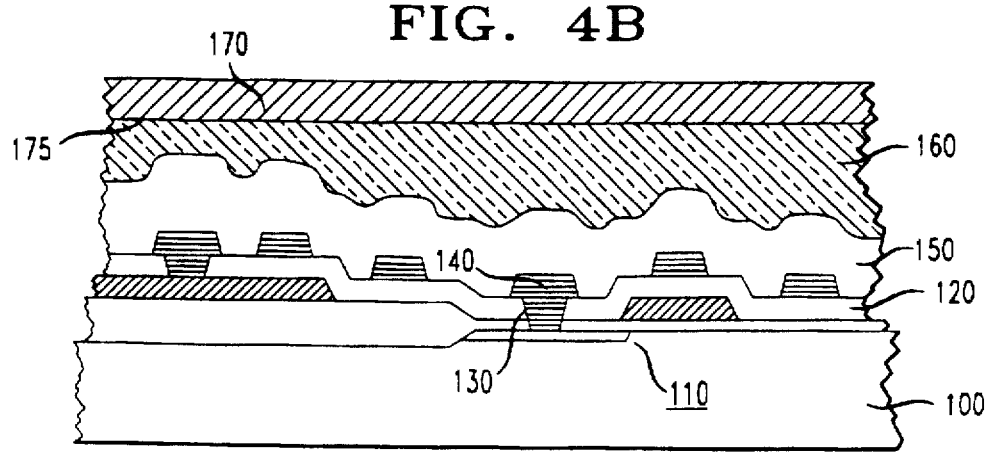

The dielectric 150 is planarized according to the process of the present invention. Otherwise, the topography of the dielectric layer 150 will be too severe for subsequent lithographic processing. As shown in FIG. 4A, a layer of planarizing material 160 is deposited over the topographic dielectric material 150. As shown in FIG. 4B, the object with the flat surface 170 is placed in contact with the planarizing material 160, thereby forcing the planarizing material 160 into planarity. The planarizing material 160 is then cured or solidified as previously described while in contact with the object's flat surface 175. The object 170 and the planarizing material 160 are then separated from contact.

Figure 5:
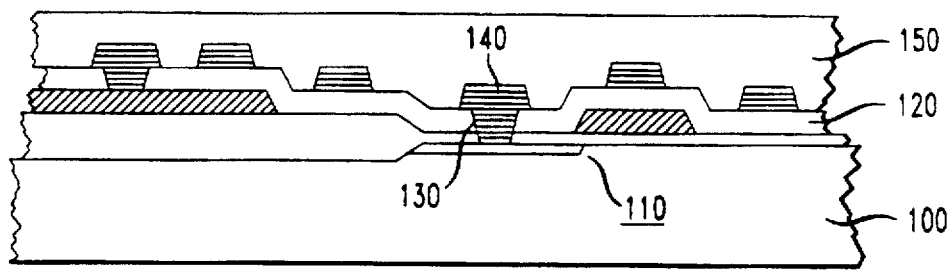

As illustrated in FIG. 5, the planarity of the planarizing material 160 is then transferred into the underlying dielectric layer 150. The planarity is transferred by etching the solidified planarizing material 160 (FIG. 4B) and enough of the underlying dielectric layer 150 to planarize the dielectric layer 150. Planarity is achieved because the etching rate of the planarizing material is approximately equal to the etching rate of the underlying dielectric layer.

The inventive fabrication procedure is not limited to the production of multilayer metallic patterns separated by dielectric layers and connected by conductive vias. A multitude of devices are advantageously fabricated. It is contemplated that, any fabrication sequence relying on a planarization step over topography is advantageously undertaken by the inventive process. The inventive process is advantageously used to planarize layers made of a variety of materials including dielectric layers such as $SiO_2$, silicon nitride (SiN), and other silica and silica-like layers. The inventive process is also advantageously used to planarize aromatic polymers, such as polyimides, or other low dielectric constant, high $T_g$ (>150° C.) materials which have an appropriate viscosity.

The following examples are exemplary of suitable conditions employed in the inventive procedure.

EXAMPLE 1

Figure 6:
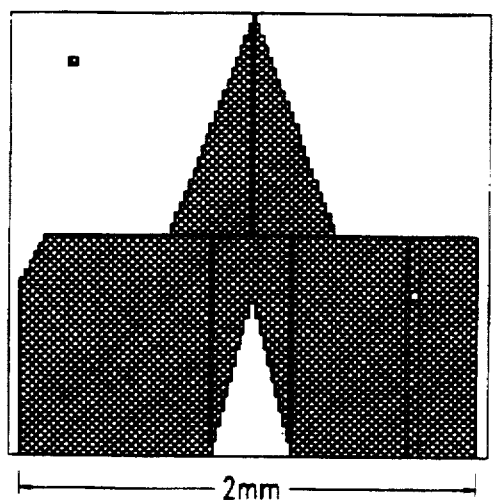
FIG. 6 is an illustration of a computer generated model of a wafer test pattern.
Figure 7:
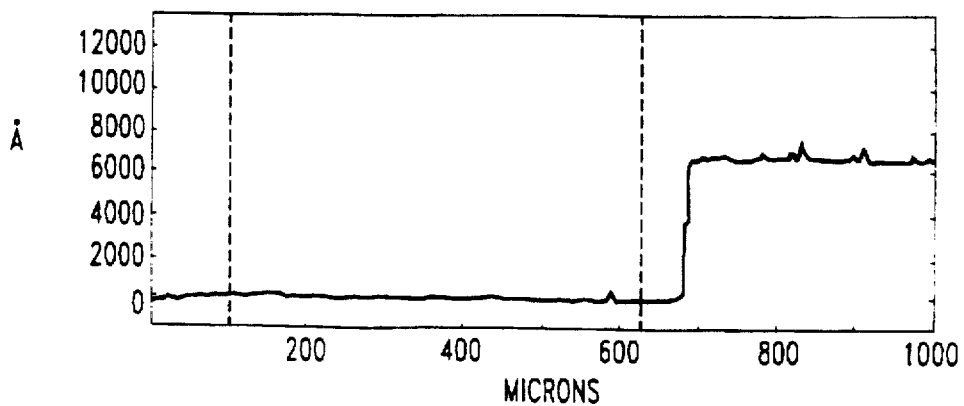
FIG. 7 is an illustration of a profilometer trace of the test pattern in FIG. 6.

Numerous 5" diameter silicon wafers with very demanding test patterns thereon were obtained. The first test pattern, illustrated schematically in FIG. 6, had a large flat region of metal, 6000 Å thick, covered with 2.5 μm of PE-TEOS that was deposited by chemical vapor deposition (CVD). This test pattern is very difficult to planarize. A profilometer trace of the pattern is illustrated in FIG. 7. The trace was obtained using a Sloan Dektak Model 3030 profilometer. The feature edge is indicated by the large jump starting at about 650 μm.

The patterned and overcoated substrate was further coated with a layer of epoxy novolac DEN-431. The novolac 431 was combined with triphenylsulphonium hexafloroantimonate photoacid generator (3% by weight) and about 2 ml of the novolac resin was initially poured on the center of the wafer.

The resin mixture on the wafer was placed in contact with an optical flat. The optical flat was made of quartz, had a 6-inch diameter, was flat to λ/10, and was obtained from General Optics of Moorpark, Calif. The optical flat was first cleaned in a heated solution of sulfuric acid and hydrogen peroxide maintained at 90° C., rinsed with deionized water and immersed in a solution of octadecyl trichlorosilane (3% by weight) in n-octane. The trichlorosilane formed a monolayer coating on the optical flat and performed the function of a release agent.

The resin was then cured by exposing the resin mixture to ultraviolet light through the optical flat. The resin was exposed for 30 seconds to light from an OAI Model 30-7 mercury-xenon arc lamp that was configured for 260 nm output.

Figure 8:
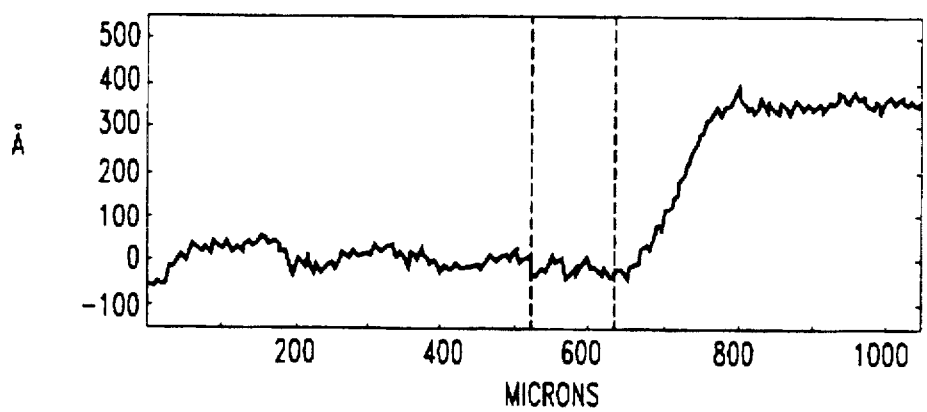
FIG. 8 is an illustration of a profilometer trace of the test pattern in FIG. 7 with a planarized layer thereover.

The optical flat was then removed from the hardened resin. The coated wafer was analyzed to determine the degree of planarity achieved over the wafer surface. A trace of the same edge that was scanned to obtain the trace illustrated in FIG. 7 is illustrated in FIG. 8. As illustrated by FIG. 8, the 6000 Å step in FIG. 7 was reduced to a less than 400 Å step in FIG. 8 which is about a 93.3% degree of planarization. If the remaining step was caused entirely by shrinkage of the novolac planarization material, the shrinkage was only about 6%.

EXAMPLE 2

Figure 9:
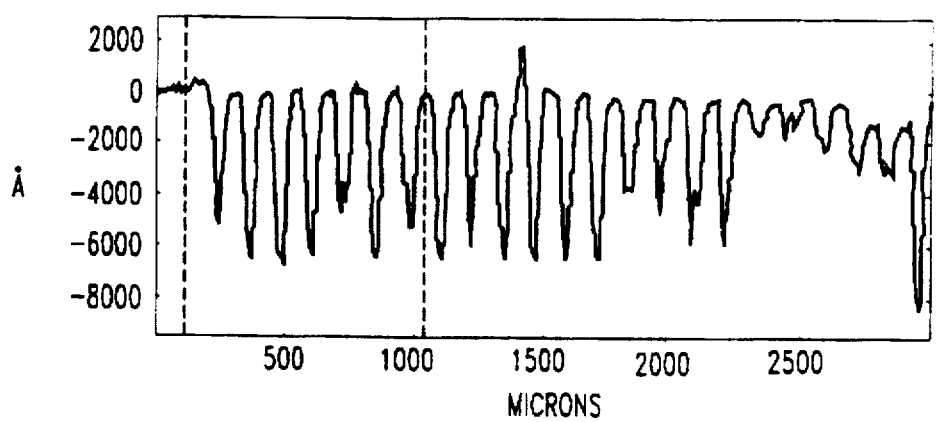
FIG. 9 is an illustration of a profilometer trace of a second planarization test pattern.

A sample 5" diameter silicon wafer with a second test pattern consisting of an array of metal squares which were 75 μm on a side and separated by 50 μm spaces was prepared. The array was formed on a silicon wafer that was five inches in diameter. The sample was covered with a 2.5

μm-thick layer of PE-TEOS. The trace in FIG. 9 illustrates the topography of the sample surface.

Figure 10:
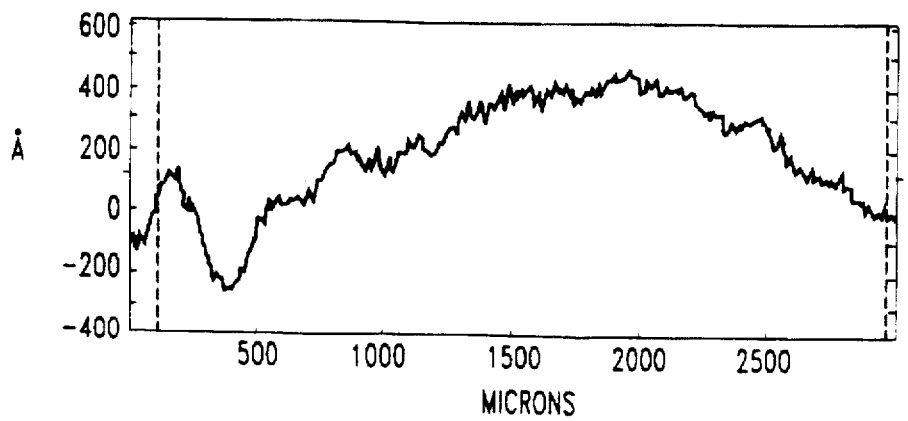
FIG. 10 is an illustration of a profilometer trace of the test pattern in FIG. 9 with a planarized layer thereover.

The sample was coated with a planarizing material using the materials and conditions described in Example 1. The material was planarized under the conditions described in Example 1. The topography of the coated pattern was measured as previously described and a trace of that scan is illustrated in FIG. 10. Note that the planarizing material had peaks of less than 100 Å over features that were 6000 Å high in FIG. 9. Some of the overall curvature of the traces illustrated in FIGS. 9 and 10 was caused by the warpage of the silicon wafer on which the pattern was deposited. Compensating for this warpage, the overall variation in topography for the surface described in FIG. 10 was about 300 Å or less which is about a 95% degree of planarization.

EXAMPLE 3

Figure 11:
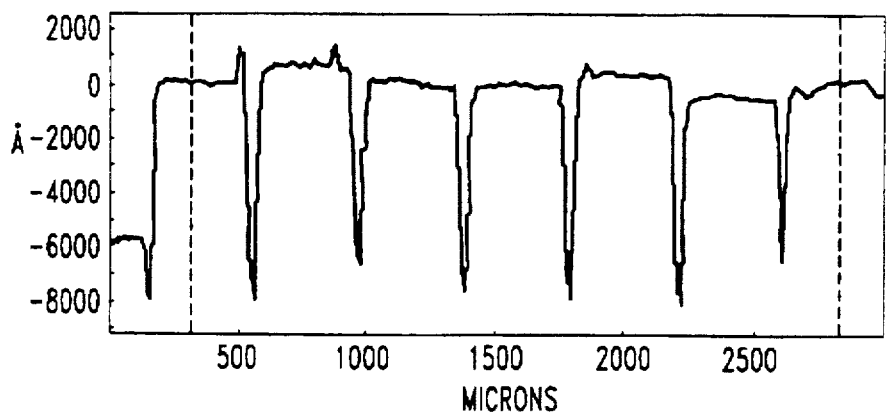
FIG. 11 is an illustration of a profilometer trace of a third planarization test pattern.

A 5" diameter silicon wafer having 400 μm×1500 μm memory arrays thereon was prepared. The arrays were covered with 2.5 μm of PE-TEOS and were separated by 60 μm spaces. The topographic thickness of each array was 8000 Å. A profilometer trace of these arrays was obtained as described in Example 1 and is illustrated in FIG. 11.

Figure 12:
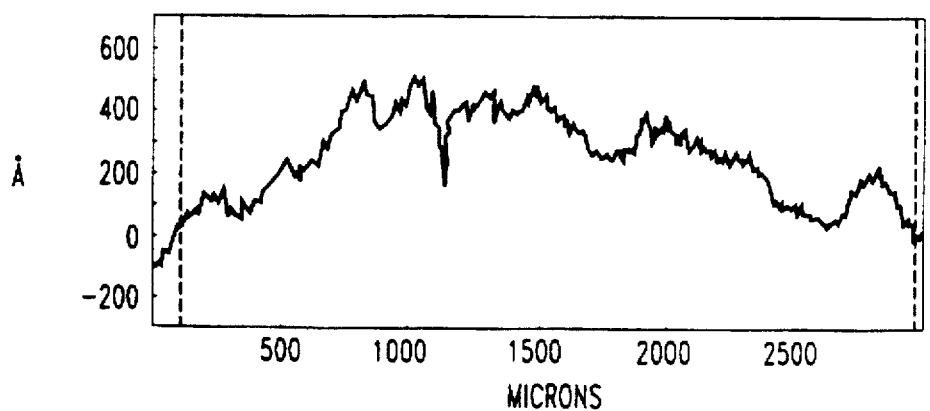
FIG. 12 is an illustration of a profilometer trace of the pattern in FIG. 11 with a planarized layer thereover.

The planarizing material described in Example 1 was deposited on the arrays and the material was planarized using the conditions described in Example 1. A trace of the planarized surface is illustrated in FIG. 12. Allowing for warpage of the silicon wafer, the surface variation in the planarized layer illustrated in FIG. 12 was less than 400 Å which is about a 95% degree of planarization.

EXAMPLE 4

Figure 13:
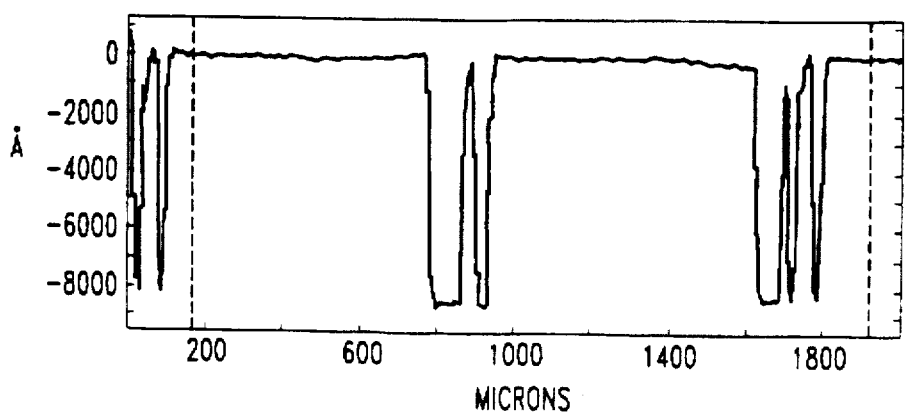
FIG. 13 is an illustration of a profilometer trace of a fourth planarization test pattern.

A 5" diameter silicon wafer with 700 μm×400 μm memory arrays thereon was prepared. The arrays were coated with a 2.5 μm-thick layer of PE-TEOS and were spaced 140 μm apart with metal runners in the spaces. A trace of a Dektak scan of this pattern, obtained as described in Example 1, is illustrated in FIG. 13. The trace shows that the features had a height of about 8500 Å.

Figure 14:
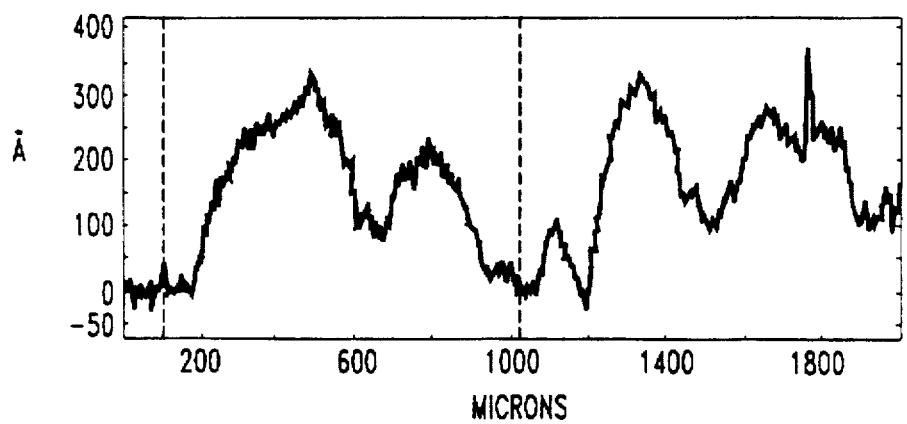
FIG. 14 is an illustration of a profilometer trace of the test pattern in FIG. 13 with a planarized layer thereover.

The wafer was then planarized using the materials and conditions described in Example 1. A trace of the planarized surface was obtained as previously described and is illustrated in FIG. 14. The trace indicates that the planarizing layer over these features had variations in height less than 300 Å, after allowing for warpage, which is about a 96.5% degree of planarization.

EXAMPLE 5

Figure 15:
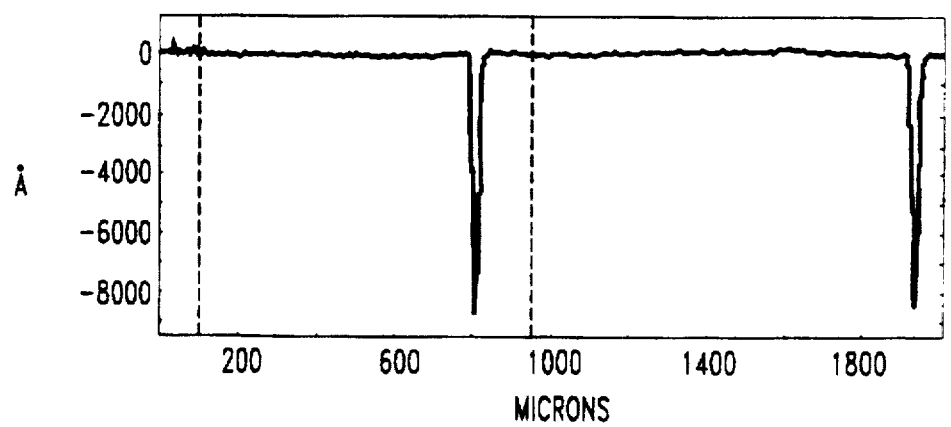
FIG. 15 is an illustration of a profilometer trace of a fifth planarization test pattern.

A silicon wafer with 1100 μm×3300 μm arrays thereon separated by 50 μm spaces was coated with a 2.5 μm-thick layer of PE-TEOS. A trace of a Dektak scan of this pattern, obtained as described in Example 1, is illustrated in FIG. 15. The trace shows that the features had a height of about 8000 Å.

Figure 16:
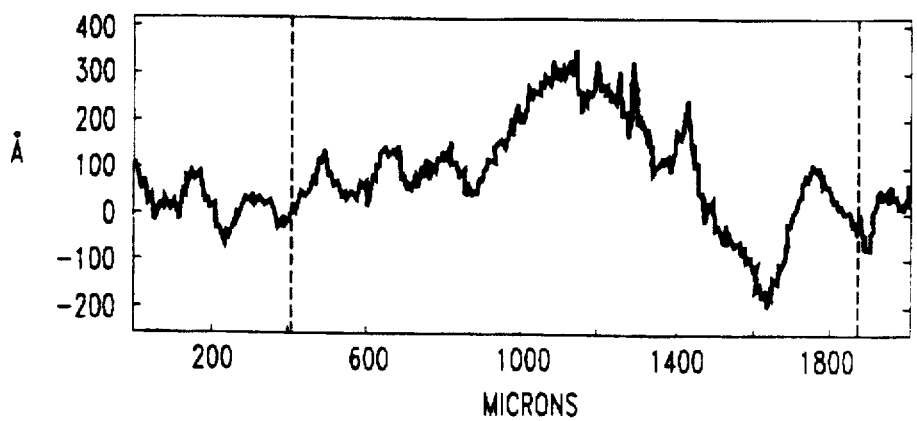
FIG. 16 is an illustration of a profilometer trace of the test pattern in FIG. 15 with a planarized layer thereover.

The wafer was then planarized using the materials and conditions described in Example 1. A trace of the planarized surface was obtained as previously described and is illustrated in FIG. 16. The trace indicates that the planarizing layer over these features had variations in height less than a few hundred Å, after allowing for warpage, which is about a 96% degree of planarization.

We claim:

1. A process for fabricating a semiconductor device comprising:

forming a planarization material region on a topographic substrate surface wherein the planarization material has a pre-planarization viscosity of about 20 cp to about 1000 cp;

contacting the planarization material region having said viscosity with a flat surface of an object with a force sufficient to substantially transfer the surface flatness from the flat surface to the material;

hardening the material while in contact with the flat surface wherein the material undergoes a reduction in volume of less than about 10%; and separating the flat surface from contact with the material.

2. The process of claim 1 wherein the force is sufficient to planarize the material to at least about eighty-five percent over the initial topography.

3. The process of claim 1 wherein the flat surface is transferred from the planarization material to the substrate underlying the material by etching.

4. The process of claim 3 wherein the etch rate of the planarization material is about equal to the etch rate of the substrate planarization material underlying the material.

5. The process of claim 4 wherein the planarization material comprises an epoxy resin.

6. The process of claim 5 wherein the epoxy resin is an aromatic epoxy resin.

7. The process of claim 5 wherein the planarization material further comprises an energy-generated acid catalyst.

8. The process of claim 7 wherein the energy-generated acid catalyst is a photoacid generator.

9. The process of claim 8 wherein the planarization material is hardened by exposing the planarization material to ultraviolet radiation.

10. The process of claim 4 wherein the material comprises a melted polymer.

11. The process of claim 10 wherein the melted polymer is hardened by cooling the melted polymer to a temperature that is below the melting point of the melted polymer.

* * * * *